(12) United States Patent
Sekiya et al.

(10) Patent No.: US 8,618,532 B2
(45) Date of Patent: Dec. 31, 2013

(54) ORGANIC THIN-FILM TRANSISTOR

(75) Inventors: Takashi Sekiya, Sodegaura (JP); Hiroaki Nakamura, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 324 days.

(21) Appl. No.: 12/999,644

(22) PCT Filed: Jun. 15, 2009

(86) PCT No.: PCT/JP2009/060845
§ 371 (c)(1),
(2), (4) Date: Dec. 17, 2010

(87) PCT Pub. No.: WO2009/154163
PCT Pub. Date: Dec. 23, 2009

(65) Prior Publication Data
US 2011/0084261 A1    Apr. 14, 2011

(30) Foreign Application Priority Data
Jun. 18, 2008    (JP) ................................ 2008-159273

(51) Int. Cl.
*H01L 29/08* (2006.01)

(52) U.S. Cl.
USPC ............... 257/40; 257/E51.001; 257/E51.005

(58) Field of Classification Search
USPC ............................................ 257/40; 438/99
See application file for complete search history.

(56) References Cited

U.S. PATENT DOCUMENTS

| | | | |
|---|---|---|---|
| 7,081,641 B2 | 7/2006 | Kawasaki et al. | |
| 7,230,267 B2 | 6/2007 | Nagayama et al. | |
| 7,348,593 B2 | 3/2008 | Koo et al. | |
| 7,372,070 B2 | 5/2008 | Yatsunami et al. | |
| 7,619,245 B2 | 11/2009 | Kim et al. | |
| 7,682,886 B2 | 3/2010 | Kim et al. | |
| 7,754,557 B2 | 7/2010 | Park et al. | |
| 8,203,139 B2 | 6/2012 | Saito et al. | |
| 2004/0161873 A1* | 8/2004 | Dimitrakopoulos et al. | ... 438/99 |
| 2006/0027805 A1 | 2/2006 | Koo et al. | |
| 2006/0237731 A1* | 10/2006 | Furukawa et al. | ............... 257/83 |
| 2007/0063195 A1 | 3/2007 | Kim et al. | |
| 2008/0042129 A1 | 2/2008 | Nakagawa et al. | |
| 2008/0067504 A1 | 3/2008 | Park et al. | |

(Continued)

FOREIGN PATENT DOCUMENTS

| | | |
|---|---|---|
| CN | 1738070 | 2/2006 |
| CN | 1909260 | 2/2007 |

(Continued)

OTHER PUBLICATIONS

Office Action for related Japanese Patent Application No. 2008 159273 issued Jul. 24, 2012.

(Continued)

*Primary Examiner* — A. Sefer
(74) *Attorney, Agent, or Firm* — Millen, White, Zelano & Branigan, P.C.

(57) ABSTRACT

A bottom-contact type organic thin film transistor comprising at least a gate electrode, an insulator layer, a source electrode, a drain electrode and an organic semiconductor layer, on a substrate, wherein at least one of the source electrode and the drain electrode has a multilayer structure formed by stacking an oxide layer and a metal layer, and the metal layer is surface-modified with an organic thin film layer.

10 Claims, 2 Drawing Sheets

(56) References Cited

U.S. PATENT DOCUMENTS

2009/0057656 A1* 3/2009 Matsubara et al. ............. 257/40
2009/0111211 A1 4/2009 Kim et al.
2010/0051919 A1 3/2010 Saito et al.

FOREIGN PATENT DOCUMENTS

| CN | 101080821 | 11/2007 |
|---|---|---|
| JP | 04 147545 | 5/1992 |
| JP | 2004 103905 | 4/2004 |
| JP | 2005 093542 | 4/2005 |
| JP | 2005 327797 | 11/2005 |
| JP | 2006 059896 | 3/2006 |
| JP | 2007 13138 | 1/2007 |
| JP | 2007110007 | 4/2007 |
| JP | 2007 158140 | 6/2007 |
| JP | 2008 60117 | 3/2008 |
| WO | WO-2008 062841 | 5/2008 |

OTHER PUBLICATIONS

Office Action for related Chinese Patent Application No. 200980123072.2 issued Jul. 26, 2012.
English Translation of Office Action for related Chinese Patent Application No. 200980123072.2 issued Jul. 26, 2012.
International Preliminary Report on Patentability for PCT/JP2009/060845 dated Feb. 17, 2011.
International Search Report for PCT/JP2009/060845 dated Jun. 30, 2009.
Kawasaki, N. et al., "Hole-injection barrier in pentacene field-effect transistor with Au elctrodes modified by $C_{16}H_{33}SH$," Applied Physics Letters, 2007, vol. 91, 123518.
Kumaki, D., "Reducing the contact resistance of bottom-contact pentacene thin film transistors by employing a $MoO_x$ carrier injection layer," Applied Physics Letters, 2008, vol. 92, 013301.
Marmont, P. et al., "Improving charge injection in organic thin-film transistors with thiol-based self-assembled monolayers," Organic Electronics, 2008, vol. 9, pp. 419-424.
Matsushita Electric Ind Co Ltd., "Organic Transistor," Patent Abstracts of Japan, Publication Date: Jun. 21, 2007; English Abstract of JP 2007 158140.
Payne, M. M. et al., "Organic field-effect transistors from solution-deposited functionalized acenes with mobilities as High as 1 cm2/Vs," J. Am. Chem. Soc., 2005, vol. 127, pp. 4986-4987.
Sony Corp., "Field effect transistor," Patent Abstracts of Japan, Publication Date: Mar. 2, 2006; English Abstract of JP-2006 059896.
Toshiba Corp., "Color image receiving tube," Patent Abstracts of Japan, Publication Date: May 21, 1992; English Abstract of JP-04 147545.
Konica Minolta Holdings Inc., "Organic thin-film transistor and manufacturing method thereof," Patent Abstracts of Japan, Publication Date: Mar. 13, 2008; English Abstract of JP-2008 060117.
Shinshu Univ., "Organic field effect transistor," Patent Abstracts of Japan, Publication Date: Apr. 26, 2007; English Abstract of JP-2007 110007.

* cited by examiner

PRIOR ART

PRIOR ART

ORGANIC THIN-FILM TRANSISTOR

TECHNICAL FIELD

The invention relates to an organic thin film transistor.

BACKGROUND ART

Organic thin film transistors have lots of excellent features such as they can be produced by employing low-temperature film formation process, it is easy to form a film on a flexible and light-weight substrate made of resins or the like, and they are suited for inexpensive solution application processes, in compared with thin film transistors using the conventional inorganic silicon thin film. Their research and development are actively preceded as the core technology for next generation of flexible electronics.

FIG. 2 is an outline cross-sectional view of a top-contact type organic thin film transistor which has a representative structure of an organic thin film transistor (hereinafter often referred to simply as an "organic TFT").

The top-contact type organic TFT 2 has, on a substrate 10, a gate electrode 20, an insulator layer 30 and an organic semiconductor layer 40 in this sequence. A drain electrode 50 and a source electrode 60 are disposed on the organic semiconductor layer 40 with a predetermined distance (channel region 70).

Like the organic TFT 2, such a structure in which a source electrode 60 and a drain electrode 50 are arranged opposite a substrate 10 via an organic semiconductor layer 40 is particularly called as a top-contact type.

In the top-contact type organic TFT 2, the organic semiconductor layer 40 forms the channel region 70, and the flow of an electric current to the source electrode 60 and the drain electrode 50 can be controlled by the voltage applied to the gate electrode 20.

The top-contact type organic TFT 2 can be fabricated as follows: on the substrate 10 on which the gate electrode 20 and the insulator layer 30 are formed, the organic semiconductor layer 40 is formed by vacuum deposition or a solution process such as spin coating, dip coating or casting, and the source electrode 60 and the drain electrode 50 are formed by, for example, vacuum deposition using a deposition mask.

FIG. 3 is an outline cross-sectional view of a bottom-contact type organic TFT.

The bottom-contact type organic TFT 3 has, on a substrate 10, a gate electrode 20 and an insulator layer 30 in this sequence. A drain electrode 50 and a source electrode 60 are disposed on the insulator layer 30 with a predetermined distance (channel region 70), and an organic semiconductor layer 40 are further stacked on the drain electrode 50 and the source electrode 60 to cover these electrodes.

Like the organic TFT 3, such a structure in which the source electrode 60 and the drain electrode 50 are formed on the substrate, and the organic semiconductor layer 40 are stacked on the source electrode 60 and the drain electrode 50 is particularly called as a bottom-contact type.

In the bottom-contact type organic TFT 3, the gate electrode 20, the source electrode 60 and the drain electrode 50 form a circuit pattern on the substrate 10, and the organic semiconductor layer 40 is formed on the circuit pattern.

For forming an electrode, known photolithography and the like can be employed. Therefore, a circuit pattern having high-resolution and a large area can be easily formed. Thus, different from the top-contact type organic TFT, in the bottom-contact type organic TFT, the organic semiconductor layer is formed on the substrate on which the circuit pattern has been previously formed. As a result, the bottom-contact type organic TFT has the advantage that the organic semiconductor material constituting the organic semiconductor layer does not deteriorate due to the physical and chemical stresses associated with the formation of electrodes.

The bottom-contact type organic TFT has the above-mentioned advantages. However, there is a problem that the properties of the bottom-contact type organic TFT are significantly inferior to a top-contact type organic TFT fabricated using the same organic semiconductor material. It is considered that in the bottom-contact type organic TFT, a large contact resistance lies between the organic semiconductor layer and the electrodes.

To solve the problem, an approach to use a multilayer structure composed of an oxide layer/metal layer for the source-drain electrodes. Namely, this approach is aimed to lower the charge-injection barrier between the electrode layer and the organic semiconductor layer using materials having a good charge-injection property for the oxide layer.

Patent Document 1 discloses a TFT wherein source-drain electrodes contact with a p-type organic semiconductor via a charge-injecting layer formed of an inorganic substance, an oxide of molybdenum or vanadium is used for the charge-injecting layer, and the inorganic charge-injecting layer having a medium energy level is disposed between the channel and the source-drain electrodes.

The effects of this TFT include decrease of the driving voltage, stabilization of the properties and increase of the reliability.

Non-Patent Document 1 discloses a TFT which has a $MoO_x$/Au electrode using $MoO_x$ in place of Cr or Ti generally used for a base layer for the Au electrode. Further, it describes that the thickness of the $MoO_x$ is preferably 2 nm.

This TFT can reduce the contact resistance between the source-drain electrodes and the organic semiconductor (pentacene) to decrease the voltage.

Different from the above-mentioned approach, an approach wherein a metal electrode is surface-modified with an organic compound having a thiol group at the terminal to form an organic thin film layer, thereby controlling the wettability of the surface of the metal electrode and the work function has been also made.

Patent Document 2 discloses a bottom-contact type TFT wherein a taper (incline) is provided with the edge portion of sourced-drain electrodes, the width of the taper is made to be smaller than the average particle diameter of semiconductor crystals, and an organic compound layer (1 Å to 10 Å) formed of a compound having a thiol group is disposed between the source-drain electrodes and the semiconductor layer.

In this TFT, the contact resistance of the interface of the source-drain electrodes/semiconductor is reduced to increase the performance.

Patent Document 3 discloses a TFT wherein thiocresol is disposed between the source-drain electrodes and the organic semiconductor film.

Patent Document 4 discloses a TFT wherein an electrode-surface treating agent having a functional group (for example, a thiol group) which forms a chemical bond with a metal is used.

This TFT has good TFT property, and solution processes which give high production efficiency can be employed.

Non-patent Document 2 discloses a TFT wherein an Au electrode is treated with a SAMs (self-assembled molecular film) such as decanethiol, $CH_3$—$(CH_2)_9$—SH (DT), perfluorodecanethiol $CF_3$—$(CF_2)_7$—$(CH_2)_2$—SH (PFDT) or perfluorohexanethiol $CF_3-(CF_2)_3-(CH_2)_2-SH$ (PFHT), to vary the work function so that charge injection from the electrode is improved.

In this TFT, for example, for the DT/Au electrode, the work function decreases by 0.45 eV, and for the PFDT/Au electrode, the work function increases by 0.9 eV. Accompanying thereto, the contact resistance increased in the case of the DT/Au electrode and decreased in the case of the PFDT/Au electrode, in comparison with the Au alone.

Non-patent Document 3 discloses a TFT wherein the hole-injection barrier is lowered by treating a Cr/Au electrode with 1-hexadecanethiol $(CH_3-(CH_2)_{15}-SH)$, and which has the following relationship:

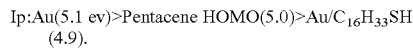
(4.9).

Non-patent Document 4 discloses a TFT wherein a gold electrode is treated with pentafluorothiophenol (PFTP) to improve the contact between the electrode-semiconductor.

In spite of the above-mentioned approaches, the problems in the bottom-contact type organic TFT of high threshold voltage, low mobility and the like cannot be completely dissolved.

An object of the invention is to provide a bottom-contact type organic TFT having a low threshold voltage, a high field-effect mobility and a high on/off current ratio.

RELATED ART DOCUMENTS

Patent Documents

[Patent Document 1] JP-A-2005-327797
[Patent Document 2] JP-A-2005-93542
[Patent Document 3] JP-A-2007-158140
[Patent Document 4] JP-A-2008-60117

Non-Patent Documents

[Non-Patent Document 1] D. Kumaki, Appl. Phys. Lett., 92, 013301 (2008).
[Non-Patent Document 2] P. Marmont et. al., Organic Electronics (2008), doi: 10.1016/j. orgel. Jan. 4, 2008.
[Non-Patent Document 3] N. Kawasaki, Appl. Phys. Lett., 91, 123518 (2007)
[Non-Patent Document 4] M. M. Payne et. al., J. Am. Chem. Soc., 127, 4986 (2005)

SUMMARY OF THE INVENTION

The inventors conducted extensive researches and found that in addition to a multilayer electrode of an oxide layer/metal layer, the TFT properties can be remarkably improved by modifying the surface of the metal layer with an organic thin film layer. The invention was accomplished by the finding.

Further, they found that significant improvement in the properties can be obtained by the work function of the oxide layer and the work function of the metal layer surface-modified with the organic thin film layer satisfying a particular relationship.

According to the invention, the following organic thin film transistor, and the like are provided:

1. A bottom-contact type organic thin film transistor comprising, on a substrate, at least a gate electrode, an insulator layer, a source electrode, a drain electrode and an organic semiconductor layer, wherein
at least one of the source electrode and the drain electrode has a multilayer structure formed by stacking an oxide layer and a metal layer, and
the metal layer is surface-modified with an organic thin film layer.

2. The organic thin film transistor according to 1, wherein the work function of the oxide layer represented by IPox and the work function of the metal layer represented by IPmm satisfy the following expression (1):

$$IPox>IPmm \qquad (1).$$

3. The organic thin film transistor according to 1 or 2, wherein the work function of the oxide layer represented by IPox and the HOMO level of the organic semiconductor layer represented by IPorg satisfy the following expression (2):

$$IPox>IPorg \qquad (2).$$

4. A method for producing the organic thin film transistor according to any of 1 to 3, comprising:
forming the organic semiconductor layer by means of a solution process.

5. An apparatus comprising the organic thin film transistor according to any of 1 to 3.

According to the invention, a bottom-contact type organic thin film transistor having a low threshold voltage, a high field-effect mobility and a high on/off current ratio.

MODE FOR CARRYING OUT THE INVENTION

The organic thin film transistor of the invention, which is a bottom-contact organic thin film transistor, comprises, on a substrate, at least a gate electrode, an insulator layer, a source electrode, a drain electrode and an organic semiconductor layer, wherein
at least one of the source electrode and the drain electrode has a multilayer structure formed by stacking an oxide layer and a metal layer, and
the metal layer is surface-modified with an organic thin film layer.

Figure 1:
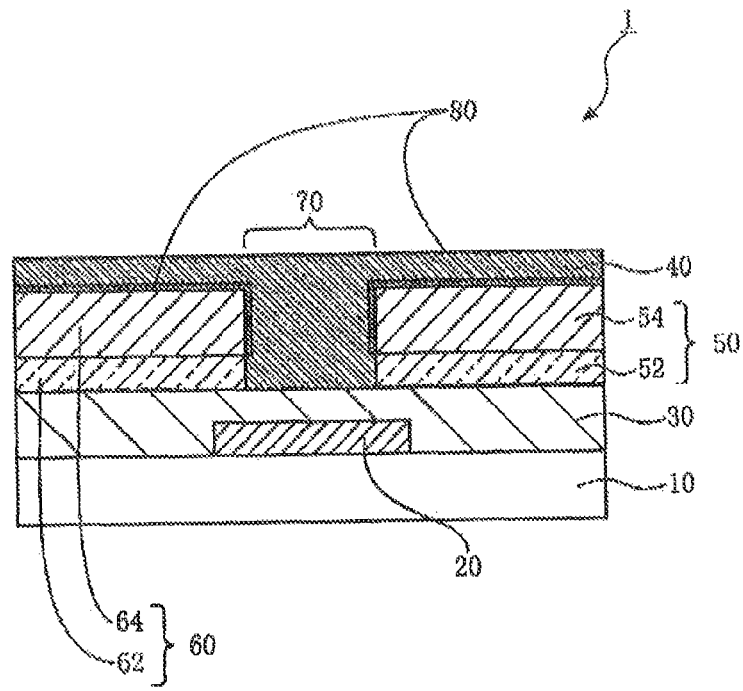
FIG. 1 is an outline cross-sectional view of one embodiment of the organic thin film transistor of the invention.
Figure 2:
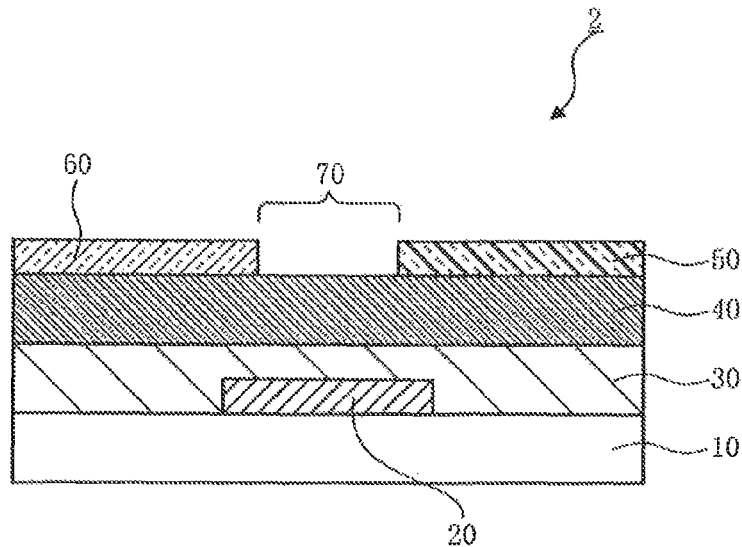
FIG. 2 is an outline cross-sectional view of a top-contact type organic thin film transistor.
Figure 3:
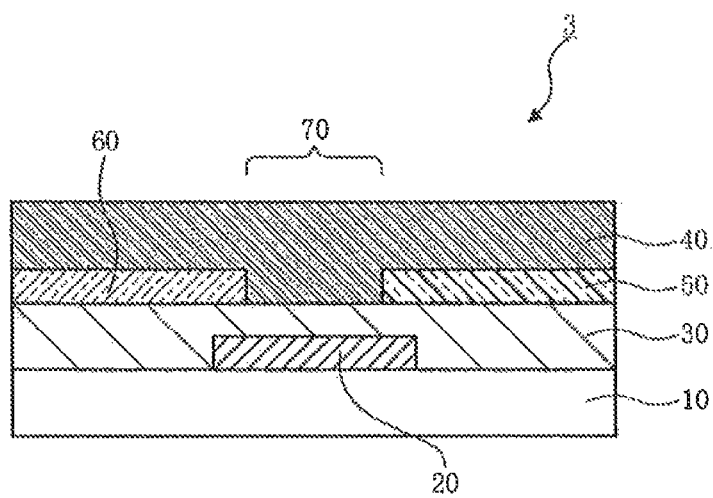
FIG. 3 is an outline cross-sectional view of a bottom-contact type organic thin film transistor.

FIG. 1 is an outline cross-sectional view of one embodiment of the organic thin film transistor of the invention.

The organic thin film transistor 1 in FIG. 1 has, on a substrate 10, a gate electrode 20 and an insulator layer 30 in this order. A drain electrode 50 which is a multilayer body of an oxide layer 52 and a metal layer 54 surface-modified with an organic thin film layer, and a source electrode 60 which is a multilayer body of an oxide layer 62 and a metal layer 64 surface-modified with an organic thin film layer are arranged on the insulator layer 30 with a predetermined distance (channel region 70). An organic semiconductor layer 40 is stacked such that it covers the drain electrode 50 and the source electrode 60.

Here, in the organic thin film transistor 1, both of the drain electrode 50 and the source electrode 60 are the multilayer bodies formed by stacking the oxide layer and the metal layer surface-modified with the organic thin film layer. However, the structures of the source and drain electrodes are not limited thereto. In the invention, at least one of the drain electrode 50 and the source electrode 60 may have the multilayer structure formed by stacking the oxide layer and the metal layer surface-modified with the organic thin film layer, and the other electrode may have a known electrode structure.

The oxide layer 52 and the oxide layer 62 may be the same or different, in the same manner, the metal layer 54 surface-modified with the organic thin film layer and the metal layer 64 surface-modified with the organic thin film layer may be the same or different.

In the invention, the term "surface-modification" means that it is enough to cover at least a part of the surface of the metal layer, which contacts with the organic semiconductor layer, with the organic thin film layer 80. Preferably, the whole surface of the metal layer, which contacts with the organic semiconductor layer, is covered with the organic thin film layer 80.

In the organic thin film transistor of the invention, at least one of the drain electrode and the source electrode has a multilayer structure in which the oxide layer and the metal layer surface-modified with the organic thin film layer are stacked.

As the material used for the oxide layer in the invention, various materials can be used as long as they are electrically conductive and exhibit a function to inject charges to the organic semiconductor layer. For example, metal oxides such as $GeO_2$, $SiO_2$, $MoO_3$, $V_2O_5$, $VO_2$, $V_2O_3$, MnO, $Mn_3O_4$, $ZrO_2$, $WO_3$, $TiO_2$, $In_2O_3$, ZnO, NiO, $HfO_2$, $Ta_2O_5$, $ReO_3$ and $PbO_2$ are preferable.

Also, $GeO_x$ ($1 \leq x \leq 2$), $SnO_2$, PbO, ZnO, GaO, CdO, ZnOS, MgInO, CdInO, MgZnO and the like are preferable.

In addition to the above-mentioned materials, oxides such as indium tin oxide (ITO), indium zinc oxide (IZO) and indium tin zinc oxide (ITZO), and oxides formed by adding thereto an element such as Ce, Nd, Sm, Eu, Tb or Ho are preferably used.

The oxide layer can be formed by deposition, electron beam deposition, sputtering, atmospheric pressure plasma processing, ion plating method, chemical vapor deposition, spin coating method, dip coating method, printing, inkjet or the like. If necessary, post-treatment such as heat treatment is combined.

The method of patterning the oxide layer formed by the above-mentioned method includes a method wherein a metal mask is used during deposition or sputtering, a method wherein a pattern is formed by a known photolithography or lift-off method to the thin film formed, and a method wherein a pattern is directly formed by inkjet method or the like.

The thickness of the oxide layer is not particularly limited, but preferably within a range of 0.2 nm to 100 nm, and more preferably within a range of 1 nm to 10 nm. When the thickness of the oxide layer is less than 0.2 nm, the charge-injection effect of the oxide layer may be lost. On the other hand, when the thickness of the oxide layer exceeds 100 nm, the internal resistance existing between the source-drain electrodes may increase and result in adverse effect such as increase of threshold voltage.

For the metal layer used in the invention, known metals and metal alloys used for a source electrode or a drain electrode of a TFT may be used.

The material used for the metal layer in the invention includes platinum, gold, silver, nickel, chromium, copper, iron, tin, antimony, lead, tantalum, indium, palladium, tellurium, rhenium, iridium, aluminum, ruthenium, germanium, molybdenum, tungsten, zinc, silver paste, lithium, beryllium, sodium, magnesium, potassium, calcium, scandium, titanium, manganese, zirconium, gallium, niobium, an alloy of sodium and potassium, a mixture of magnesium and copper, a mixture of magnesium and silver, a mixture of magnesium and aluminum, a mixture of magnesium and indium, a mixture of aluminum and aluminum oxide and a mixture of lithium and aluminum.

The metal layer can be formed by deposition, electron beam deposition, sputtering, atmospheric pressure plasma processing, ion plating, chemical vapor deposition, electrodeposition, electroless plating, spin coating, printing or inkjet, for example.

The patterning method used, if necessary, includes a method wherein the metal layer formed by the above-mentioned method is formed into an electrode by known photolithography or lift-off method, and a method wherein resist is formed on a metal foil made of aluminum, copper or the like by heat transfer, inkjet or the like, followed by etching.

The thickness of the metal layer is not particularly limited as long as electric current can flow, but preferably within a range of 0.2 nm to 10 μm, and more preferably within a range of 4 nm to 300 nm.

When the thickness of the metal layer is less than 0.2 nm, resistance may increase due to small thickness and voltage may decrease. On the other hand, when the thickness of the metal layer exceeds 10 μm, formation of the metal layer may take too long time, or at the time of stacking other layer such as a protection layer or an organic semiconductor layer, bumps may be generated so that a multilayer film may not be formed smoothly.

For the organic thin film layer which modifies the surface of the metal layer, various materials may be used which have the compatibility with the metal layer and can cover the surface of the metal layer to conduct surface-modification. Of the materials capable of being used for the organic thin film layer, materials known as a self-assembled monomolecular film (SAMs) agent are preferable, and more preferred are self-assembled monomolecular film agents having a terminal group capable of adhering to the surface of the metal layer by means of a coupling reaction.

The material for the organic thin film layer includes thiophenols such as pentafluorothiophenol (PFTP), fluorothiophenol (FTP), (trifluoromethyl)thiophenol (TFMTP), nitrothiophenol (NTP), Chlorothiophenol (CTP) and methoxythiophenol (MOTP), alkanethiols such as pentanethiol (PT), octanethiol (OT), decanethiol (DT) and stearyl mercaptan (SM), and fluorinated alkanethiols such as heptadecafluoro-1-decanethiol (HDFDT) and tridecafluoro-1-octanethiol (TDFOT) which are obtained by partial fluorination of the alkanethiols, and aromatic alkanethiols such as (ω-(biphenyl-4-yl)alkanethiol.

The surface-modification of the metal layer with the organic thin film layer can be conducted by immersion of the substrate on which the metal layer is formed in a solution prepared by dissolving the above-mentioned material for the organic thin film layer in a solvent such as dichloromethane or ethanol.

The concentration of the solution is normally 0.1 to 100 mM, and preferably 0.1 to 10 mM. The immersion time varies depending upon the material used, temperature of the solution or the like, but normally 1 minute to 24 hours, and preferably 10 minutes to 6 hours at room temperature.

It is assumed that the metal layer surface-modified with the organic thin film layer changes in the wettability of a material for the organic semiconductor layer to the source electrode or drain electrode which is formed of the metal layer, and in the morphology of an organic semiconductor crystal on the electrode, as a result, the conjunction of the metal layer and the organic semiconductor layer which are located in the channel region is improved to reduce the contact resistance.

The SAM agent suitable as the organic thin film material which surface-modifies the metal layer has a dipole in the molecule. By covering the surface of the metal layer with the SAM agent, the effective work function of the surface of the metal is changed. As a result, it is assumed that the barrier of charge injection from the metal layer to the organic semiconductor layer is lowered to reduce the contact resistance.

From the view point of the charge injection to the organic semiconductor layer, it is expected that the oxide layer rather exhibits larger effect, which acts as the foundation of the metal electrode and directly contacts with the organic semiconductor layer, particularly, the portion thereof nearest the insulator layer which forms a channel. However, the mobility of a bottom-contact type TFT wherein, for example, source and drain electrodes are multilayer bodies formed simply of an oxide layer (e.g. molybdenum oxide) and a metal layer (e.g. gold), is smaller than that of a top-contact type TFT having the same material constitution by one or more order. Also, the bottom-contact type TFT wherein the electrodes are formed only of a metal layer surface-modified with an organic thin film layer, is improved in the properties in comparison with the bottom-contact type TFT having the source and drain electrodes formed only of a metal layer. However, its mobility is inferior to that of a top-contact type TFT. In the invention, by the combination of a multilayered electrode formed of stacking an oxide layer/a metal layer and modification of the electrode with an organic thin film layer, the bottom-contact type organic thin film transistor of the invention can exhibit the performance not inferior to that of the top-contact type TFT.

In the bottom-contact type organic thin film transistor of the invention, when the work function of the oxide layer is represented by IPox and that of the metal layer by IPmm, IPox and IPmm preferably satisfy the following expression (1):

$$IPox > IPmm \quad (1).$$

Also, in the bottom-contact type organic thin film transistor of the invention, when the work function of the oxide layer is represented by IPox and the HOMO level of the organic semiconductor layer by IPorg, IPox and IPorg preferably satisfy the following expression (2):

$$IPox > IPorg \quad (2).$$

As the material used for the organic semiconductor layer, known organic semiconductors used for an organic thin film transistor may be widely used. For instance, organic semiconductor materials described in Chemical Review, Vol. 107, p. 1066, 2007, etc. may be mentioned.

Specific examples of the materials used for the organic semiconductor layer include the following materials (1) to (3):
(1) Acenes, which may have a substituent, such as naphthalene, anthracene, tetracene, pentacene, hexacene and heptacene Examples of the above-mentioned acenes include compounds having a styryl structure represented by $C_6H_5$—CH=CH—$C_6H_5$, such as 1,4-bisstyrylbenzene, 1,4-bis(2-methylstyryl)benzene, 1,4-bis(3-methylstyryl)benzene (4MSB), 1,4-bis(4-methylstyryl)benzene and polyphenylenevinylene, and oligomers and polymers thereof.
(2) Compounds containing a thiophene ring The above-mentioned compounds containing a thiophene ring include the following (i) to (iii):
(i) Thiophene oligomers, which may have a substituent, such as derivatives of α-4T, α-5T, α-6T, α-7T and α-8T
(ii) Thiophene-based polymers such as polyhexylthiophene and poly(9,9-dioctylfluorenyi-2,7-diyl-co-bithiophene)
(iii) Fused oligothiophenes such as bisbenzothiophene derivatives, α,α'-bis(dithieno[3,2-b:2',3'-d]thiophene), cooligomers of dithienothiophene-thiophene and pentathienoacene (preferably compounds having a thienobenzene skeleton or a dithienobenzene skeleton, and dibenzothienobenzothiophene derivatives)
(3) Selenophene oligomers, non-metallic phthalocyanine, copper phthalocyanine, lead phthalocyanine, titanyl phthalocyanine, porphyrins such as platinum porphyrin, porphyrin and benzoporphyrin, tetrathiafulvalene (TTF) and derivatives thereof, and rubrene and derivatives thereof By increase of the purity of the material for the organic semiconductor layer, the field-effect mobility, the on/off ratio and the like of the resultant organic thin film transistor can be further improved. Therefore, the material for the organic semiconductor layer is desirably purified by means of column chromatography, recrystallization, distillation, sublimation or the like, if necessary. The purity of the material for the organic semiconductor layer can be increased by repeating the purification method and/or by combination of the plural methods. Preferably, sublimation refining is repeated twice or more times at the final step of the purification.

The material for the organic semiconductor layer has a purity measured by HPLC of preferably 90% or higher, more preferably 95% or higher, and particularly preferably 99% or higher. By using the material for the organic semiconductor layer having such a high purity, the resultant organic thin film transistor can be increased in the field-effect mobility, the on/off ratio and the like.

Here, the organic semiconductor layer may be formed of a mixture of a plurality of the above-mentioned materials for the organic semiconductor, or may be a multilayer body of plural layers formed of different materials.

The thickness of the organic semiconductor layer is not particularly limited. However, it is normally 0.5 nm to 1 μm and preferably 2 nm to 250 nm. When the thickness of the organic semiconductor layer is smaller than 0.5 nm, a channel which can transport charges may not be formed effectively. On the other hand, when the thickness of the organic semiconductor layer exceeds 1 μm, a problem may be caused that grain boundary grows, abruption easily occurs, and the like.

The organic semiconductor layer can be formed by employing a known method, which includes molecular beam epitaxy (MBE method), vacuum deposition, chemical vapor deposition, printing and application methods such as dipping, spin coating, casting, bar coating and roll coating of a solution in which a material is dissolved in a solvent, baking, electropolymerization, molecular beam deposition, self-assembly from a solution, and combinations of these methods.

In the invention, the organic semiconductor layer is preferably formed by a solution process.

The solution process means a process for forming an organic semiconductor layer by printing or application of a solution of a material in a solvent by means of dipping, spin coating, casting, bar coating, roll coating, inkjet or the like.

By increasing the crystallinity of the organic semiconductor layer, the field-effect mobility of an organic TFT can be increased. Thus, when the organic semiconductor layer is formed by means of a vapor deposition (deposition, sputtering or the like), the temperature of the substrate during film formation is desirably maintained at a high temperature. The temperature of the substrate is preferably 50 to 250° C. and more preferably 70 to 150° C.

Further, regardless of the film forming method used, annealing is preferably conducted after the formation of the organic semiconductor layer, since an organic thin film transistor having a high performance can be obtained. The annealing temperature is preferably 50 to 200° C. and more preferably 70 to 200° C. The annealing time is preferably 10 minutes to 12 hours and more preferably 1 to 10 hours.

Other parts of the bottom-contact type organic thin film transistor of the invention will be explained below.

The substrate of the organic thin film transistor of the invention plays the role of supporting the organic thin film transistor structure.

Materials for the substrate include inorganic compounds such as glass, metal oxides and metal nitrides, plastic films (PET, PES, PC and polyimides), metal substrates, and composites and multilayer bodies thereof. Here, when the organic thin film transistor structure can be sufficiently supported by a component other than the substrate, no substrate may be used.

When using a plastic film as the material for the substrate, for the purpose of imparting solvent resistance or gas barrier properties to the substrate, a thin film formed of other resin material, an inorganic material, a metal material or an oxide material may be stacked or coated on the plastic film.

There may be a case where a silicon (Si) wafer is used as the material for the substrate. However, when the silicon wafer is used as the material for the substrate, the silicon itself can be used both as a substrate and a gate electrode. Here, there may be a case where a metal layer such as gold is formed as a lead-out electrode for connecting a lead wire on the silicon substrate having the function of the gate electrode.

Further, the surface of the silicon substrate is oxidized to form a $SiO_2$ layer, and the layer can be used as an insulator layer.

The gate electrode can be formed by using known materials widely, which have conductivity and can form a film, such as metal materials, alloy materials and metal oxide materials used for the source and drain electrodes and the gate electrode of the TFT.

As the material for the gate electrode, the materials usable for the above-mentioned metal layer and oxide layer can be suitably used. Particularly preferable materials used for the gate electrode include metals such as Au, Ag, Cu and Al, alloy materials and paste materials containing them, and materials for an oxide transparent electrode such as ITO and IZO.

Patterning of the gate electrode can be conducted by the method same as those for the above-mentioned metal layer and oxide layer.

Material for the insulator layer is not particularly limited as long as it has the electric insulation and can be formed into a thin film. Examples thereof include materials which have an electric resistivity at room temperature of 10 Ωcm or more, such as metal oxides (including an oxide of silicon), metal nitrides (including a nitride of silicon), polymers and organic low molecules. Preferred are inorganic oxides having a high dielectric constant.

The inorganic oxides include silicon oxide, aluminum oxide, tantalum oxide, titanium oxide, tin oxide, vanadium oxide, barium strontium titanate, barium titanate zirconate, lead zirconate titanate, lead lanthanum titanate, strontium titanate, barium titanate, barium magnesium fluoride, lanthanum oxide, fluorine oxide, magnesium oxide, bismuth oxide, bismuth titanate, niobium oxide, strontium bismuth titanate, bismuth strontium tantalate, tantalum pentaoxide, bismuth tantalate niobate and trioxide yttrium, and mixtures thereof. Silicon oxide, aluminum oxide, tantalum oxide and titanium oxide are preferable.

In addition to the above-mentioned inorganic oxides, inorganic nitrites such as silicon nitrites ($Si_3N_4$, $Si_xN_y$ (x, y>0)) and aluminum nitrites are also suitably used.

The insulator layer may be formed of a precursor material containing a metal alkoxide. For example, the substrate is coated with a solution of the precursor material, followed by a chemical solution processing including heat treatment, to form an insulator layer.

The metal of the metal alkoxide is selected from transition metals, lanthanides and main-group elements, for example. Specific examples thereof include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc) and yttrium (Y).

As the alkoxide of the metal alkoxide, alkoxides derived from alcohols such as methanol, ethanol, propanol, isopropanol, butanol and isobutanol; and alkoxyalcohols including methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol and heptoxypropanol may be mentioned.

By forming the insulator layer with the above-mentioned material, polarization likely occurs within the insulator layer. As a result, the threshold voltage of the organic TFT operation can be reduced. In particular, when silicon nitrides such as $Si_3N_4$, $Si_xN_y$ and $SiON_x$ (x, y>0) of the above-mentioned materials, are used to form the insulator layer, polarization more likely occurs, and the threshold voltage can be further reduced.

Organic compounds usable for the insulator layer include polyimides, polyamides, polyesters, polyacrylates, photo-curable resins for the photo radical-initiated polymerization system, photo-curable resins for the photo cation-initiated polymerization system, copolymers containing an acrylonitrile component, polyvinyl phenols, polyvinyl alcohols, Novolak resin and cyanoethyl pullulan. In addition to these organic compounds, polymer materials having a high dielectric constant, such as waxes, polyethylene, polychloroprene, polyethylene terephthalate, polyoxymethylene, polyvinyl chloride, polyvinylidene fluoride, polymethylmethacrylate, polysulfone, polycarbonate, polyimide, cyanoethylpullulan, poly(vinylphenol) (PVP), poly(methyl methacrylate) (PMMA), polycarbonate (PC), polystyrene (PS), polyolefins, polyacrylamide, poly(acrylic acid), Novolak resin, resol resins, polyimide, polyxylylene, epoxy resins and pullulan can be used.

Among the organic compounds usable for the insulator layer, particularly preferred are organic compounds having water repellency. By using the organic compound having water repellency for the insulator layer, the interaction between the insulator layer and the channel control layer is controlled so that the amorphous nature which the channel control layer has can be kept. As a result, the channel control layer can fulfill its function to improve the TFT performance.

The organic compounds having water repellency include poly(p-xylylene) derivatives disclosed in Yasuda et al., Jpn. J. Appl. Phys., Vol. 42 (2003) pp. 6614-6618, and compounds disclosed in Janos Veres et al., Chem. Mater., Vol. 16 (2004) pp. 4543-4555.

The insulator layer may be a mixture layer using a plurality of the materials of the above-mentioned inorganic compounds and organic compounds, or a multilayer body in which different layers formed of these materials are stacked. In this case, the TFT performance can be controlled by mixing the material having high dielectric constant and the material having water repellency, or by stacking different layers formed of these materials, if necessary.

The insulator layer may be an anodic oxide film, or may contain the anodic oxide film as the component. The anodic oxide film is preferably subjected to sealing treatment. The anodic oxide film is formed by anodizing a metal capable of being anodized by means of a known method.

The metal capable of being anodized includes aluminum and tantalum.

The method of anodizing treatment is not particularly limited, and a known method can be used. An oxide coating film is formed by the anodizing treatment. The electrolyte used for the anodizing treatment is one capable of forming a porous oxide coating film. In general, sulfuric acid, phosphoric acid, oxalic acid, chromic acid, boric acid, sulfamic acid, benzenesulfonic acid or the like, a mixed acid of a combination of two or more kinds thereof, or a salt thereof is used.

The condition for anodizing treatment varies depending upon the electrolyte used. However, the treatment is normally conducted under the following conditions: the concentration of the electrolyte being 1 to 80 mass %, the temperature of the electrolyte being 5 to 70° C., the current density being 0.5 to 60 $A/cm^2$, the voltage being 1 to 100 V, and the electrolysis time being 10 seconds to 5 minutes. In a preferable method of anodizing treatment, an aqueous solution of sulfuric acid, phosphoric acid or boric acid is used as the electrolyte, and the treatment is conducted with direct current. However, alternating current may be used. The concentration of the acid is preferably 5 to 45 mass %, and the electrolytic treatment is preferably conducted at the temperature of the electrolyte of 20 to 50° C., at a current density of 0.5 to 20 $A/cm^2$ for 20 to 250 seconds.

The thickness of the insulator layer is normally 10 nm to 5 μm, preferably 50 nm to 2 μm and more preferably 100 nm to 1 μm.

When the thickness of the insulator layer is smaller than 10 nm, the effective voltage applied to the organic semiconductor increases so that the driving voltage and the threshold voltage of the TFT itself can be reduced. However, the leakage current between the source-gate may increase adversely.

The method of forming the insulator layer should be selected depending upon the material used for the insulator layer. The method includes dry processes such as vacuum deposition method, molecular beam epitaxy, ion cluster beam technique, low-energy ion beam technology, ion plating, CVD, sputtering, and atmospheric pressure glow plasma processing disclosed in JP-A-H11-61406, JP-A-H11-133205, JP-A-2000-121804, JP-A-2000-147209 and JP-A-2000-185362; wet processes, for example, application methods such as spray coating, spin coating, blade coating, dip coating, casting, roll coating, bar coating and die coating, and methods for patterning such as printing and inkjet.

As a wet process, a method wherein a liquid in which fine particles of an organic oxide disperse in any organic solvent or water with the aid of a dispersion aid such as a surfactant, if necessary, is applied and dried; or a sol-gel method wherein a solution of an oxide precursor such as an alkoxide form is applied and dried, is used.

The organic thin film transistor of the invention is formed in such a manner that the source electrode and the drain electrode are opposed to each other with a predetermined distance. The distance between the source electrode and the drain electrode is normally 0.1 μm to 1 mm, preferably 1 μm to 100 μm, and more preferably 5 μm to 100 μm.

For the source electrode and the drain electrode having no multilayer structure in which the oxide layer and the metal layer are staked, known materials having electrical conductivity and capable of forming a film, such as the metal materials, alloy materials, metal oxide materials and the like, used for the source and drain electrodes and the gate electrode in the TFT can be widely used.

Particularly preferable materials used for the source electrode and the drain electrode include metals such as Au, Ag, Cu and Al, alloy materials and paste materials containing them, and oxide transparent electrode materials such as ITO and IZO.

Patterning of the source electrode and the drain electrode can be conducted by the same method as the above-mentioned methods for the metal layer and the oxide layer.

The organic thin film transistor of the invention has low threshold voltage, high field-effect mobility and high on/off current ratio, and is suitably used for various electronic circuits, personal computers, displays, mobile-phones, RF tags, goods price tags, various kinds of sensors, for example.

EXAMPLES

Example 1

Fabrication of Organic Thin Film Transistor

A bottom-contact type organic thin film transistor was fabricated by the following procedure:

A Si substrate (N-type, specific resistance of 1 Ωcm, double as the gate electrode) is surface-modified by thermal oxidation to form a thermal oxidation film having a thickness of 300 nm on the substrate to make it to be an insulator layer. Further, the $SiO_2$ opposite side of the $SiO_2$ film becoming the insulator layer of the substrate was fully removed by dry etching, then, chromium film was formed by sputtering to a thickness of 20 nm on the surface after removing $SiO_2$. Further, gold (Au) film was formed to a thickness of 100 nm on the chromium film by sputtering to make it to be a lead-out electrode for the gate electrode. The resultant substrate was washed by ultrasonic cleaning with a neutral detergent, pure water, acetone and ethanol each for 30 minutes.

Subsequently, the above-mentioned substrate was set in a vacuum deposition apparatus (manufactured by ULVAC, EX-400), molybdenum oxide was deposited through a metal mask at a deposition rate of 0.05 nm/s to a thickness of 2 nm to form an oxide layer, followed by deposition of gold at a deposition rate of 0.05 nm/s to a thickness of 50 nm to form a metal layer. The multilayer electrodes of the oxide layer/metal layer (source-drain electrodes) were made to have a distance (channel length L) of 75 μm and a width (channel width W) of 5 mm.

The substrate was once taken out from the deposition apparatus and immersed in a dichloromethane solution (1 mM) of PFTP (2,3,4,5,6-pentafluorothiophenol) at room temperature for 6 hours to form an organic thin film layer on the metal layer, to make the metal layer to be a surface-modified metal layer, followed by rinse with dichloromethane and chloroform.

The substrate after rinse was again set in the vacuum deposition apparatus, and pentacene was deposited thereon at a deposition rate of 0.05 nm/s to a thickness of 50 nm to make it to be an organic semiconductor layer. Thus, an organic thin film transistor was fabricated.

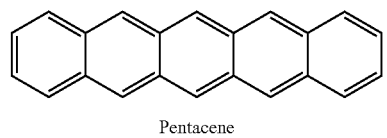 [SMILES: c1ccc2cc3cc4cc5ccccc5cc4cc3cc2c1]

Pentacene

A gate voltage of 0 to −100 V was applied to the gate electrode of the resultant organic thin film transistor, and a voltage was applied to between the source-drain to flow a current. In this case, holes were induced to the channel region (between the source-drain) of the organic semiconductor layer, and the resultant organic thin film transistor operated as a p-type transistor. As a result, the on/off ratio of the current between the source-drain electrodes at the current saturation region was $4 \times 10^3$. Further, the field-effect mobility μ was calculated with the following expression (A) to give 0.30 cm$^2$/Vs, and the threshold voltage $V_T$ was −5.7 V. Table 1 shows the results.

$$I_D = (W/2L) \cdot C\mu \cdot (V_G - V_T)^2 \quad (A)$$

wherein $I_D$ is a current between the source-drain, W is a channel width, L is a channel length, C is an electrical capacity per a unit area of the gate insulator layer, $V_T$ is a gate threshold voltage and $V_G$ is a gate voltage.

Here, the on/off ratio was obtained as a ratio of the maximum value (on) and the minimum value (off) of the drain current $I_D$ when the gate voltage $V_G$ was varied from 0 to −100 V at a voltage applied to the source-drain electrodes of −100 V.

[Evaluation of Oxide Layer, Surface-Modified Metal Layer and Organic Semiconductor Layer]

The oxide layer, surface-modified metal layer and the organic semiconductor layer of the resultant organic thin film transistor were evaluated as follows:

A multilayer body composed only of gold and PFTP was prepared in the same manner as in the case of the fabrication of the organic thin film transistor except that the metal layer was formed using no metal mask. For the resultant multilayer body, the effective work function was measured using an open air photoelectron spectrometer AC3 (manufactured by RIKEN KEIKI CO., LTD.) to give IPmm 5.6 eV.

Further, in the same manner as in the case of the fabrication of the organic thin film transistor, a thin film composed only of molybdenum oxide was formed and the effective work function thereof was measured using the open air photoelectron spectrometer AC3 to give IPox=5.7 eV. As a result, it was confirmed that IPox>IPmm.

A thin film composed only of pentacene was formed in the same manner as in the case of the fabrication of the organic thin film transistor and the HOMO level was evaluated using the open air photoelectron spectrometer AC3 to give Iorg=5.2 eV. As a result, it was confirmed that IPox>IPorg.

Table 2 shows the above-mentioned results.

Example 2

An organic thin film transistor was fabricated and evaluated in the same manner as in Example 1 except that FTP (4-fluorothiophenol) was used in place of PFTP as the material for the organic thin film layer. As a result, the on/off ratio was $3 \times 10^3$, the field-effect mobility was 0.15 cm$^2$/Vs and the threshold voltage was −4.7 V. Table 1 shows the results.

Further, a multilayer body composed only of gold and FTP was prepared and evaluated in the same manner as in Example 1. As a result, it was confirmed that IPmm=5.3 eV and IPox>IPmm.

Table 2 shows the results.

Example 3

A bottom-contact type organic thin film transistor was fabricated according to the following procedures:

A glass substrate was subjected to ultrasonic cleaning with a neutral detergent, pure water, acetone and ethanol each for 30 minutes. Then, gold film was formed to a thickness of 40 nm by sputtering to make it to be a gate electrode. Subsequently, the substrate was set in a thermal CVD apparatus. The raw material for an insulator layer of 250 mg of a poly (p-xylene) derivative (poly(chloro-p-xylene); Parylene, trade name: diX-C, manufactured by DAISAN KASEI CO., LTD.) was put in a petri dish and disposed in an evaporation zone. The thermal CVD apparatus was vacuated with a vacuum pump to reduce the inner pressure down to 5 Pa. Then, the evaporation zone was heated to 180° C. and a polymerization zone to 680° C., and they were left to stand for 2 hours to form an insulator layer having a thickness of 800 nm, which was composed of Parylene, on the gate electrode.

Subsequently, the resultant substrate was set in a vacuum deposition apparatus (manufactured by ULVAC, EX-400). Molybdenum oxide was deposited through a metal mask at a deposition rate of 0.05 nm/s to a thickness of 2 nm on the substrate to form an oxide layer, followed by deposition of gold at a deposition rate of 0.05 nm/s to a thickness of 50 nm to form a metal layer. The multilayer electrodes (source-drain electrodes) of the oxide layer/metal layer were formed to have a distance (channel length, L) of 75 μm and a width (channel width, W) of 5 mm.

The substrate was once taken out from the deposition apparatus, immersed in a dichloromethane solution (1 mM) of PFTP for 6 hours to form an organic thin film layer on the metal layer to make it to be a surface-modified metal layer, followed by rinse with dichloromethane and chloroform.

The substrate rinsed was again set in the vacuum deposition apparatus, and pentacene was deposited at a deposition rate of 0.05 nm/s to a thickness of 50 nm to form an organic semiconductor layer. Thus, the organic thin film transistor was fabricated.

The resultant organic thin film transistor was evaluated in the same manner as in Example 1. As a result, the on/off ratio was $6 \times 10^3$, the field-effect mobility 0.10 cm$^2$/Vs and the threshold voltage −17.9 V. Table 1 shows the results.

Example 4

An organic thin film transistor was fabricated and evaluated in the same manner as in Example 3 except that the thickness of the oxide layer was changed to 5 nm and FTP was used as the material for the organic thin film layer in place of PFTP. As a result, the on/off ratio was $2 \times 10^4$, the field-effect mobility 0.12 cm$^2$/Vs and the threshold voltage −21.2 V. Table 1 shows the results.

Example 5

An organic thin film transistor was fabricated and evaluated in the same manner as in Example 1 except that TFMTP (4-(trifluoromethyl)thiophenol) was used as the material for the organic thin film layer in place of PFTP. As a result, the on/off ratio was $3 \times 10^3$, the field-effect mobility 0.095 cm$^2$/Vs, and the threshold voltage −1.4 V. Table 1 shows the results.

Further, a multilayer body composed only of gold and TFMTP was formed and evaluated in the same manner as in Example 1. As a result, it was found that IPmm=5.8 eV and IPox<IPmm. Table 2 shows the results.

Example 6

An organic thin film transistor was fabricated and evaluated in the same manner as in Example 1 except that the thickness of the oxide layer was changed to 5 nm and 4MSB was used as the material for the organic semiconductor layer in place of pentacene. As a result, the on/off ratio was $8 \times 10^4$, the field-effect mobility 0.038 cm²/Vs, and the threshold voltage −7.3 V. Table 1 shows the results.

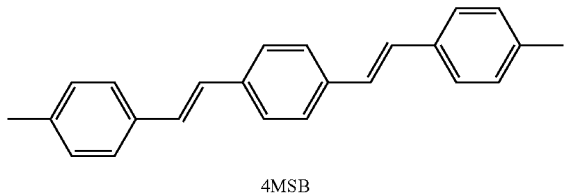

4MSB

Further, in the same manner as in Example 1, a thin film was formed only of 4MSB, and the HOMO level was evaluated. As a result, Iorg=5.6 eV and IPox>IPorg.

Example 7

An organic thin film transistor was fabricated and evaluated in the same manner as in Example 6 except that a multilayer body of an oxide layer/metal layer formed using the target 1 prepared by the following method, in place of molybdenum oxide. As a result, the on/off ratio was 3×10⁴, the field-effect mobility 0.042 cm²/Vs and the threshold voltage −6.9 V. Table 1 shows the results.
Preparation of Target 1

A powder mixture of indium oxide, tin oxide, zinc oxide and europium oxide, which were mixed such that the molar ratio of indium (In/(In+Sn+Zn)) was 0.8, the molar ratio of tin (Sn/(In+Sn+Zn)) 0.1, and the molar ratio of zinc (Zn/(In+Sn+Zn)) 0.1, and the molar ratio of europium relative to the whole amount of the metal elements (Eu/(In+Sn+Zn+Eu)) was 0.04, and which had an average particle diameter of 1 μm or less, was placed in a wet ball mill container and mixed and pulverized over 72 hours. Subsequently, the resultant pulverized powder was granulated and press-molded to form pellets. The resultant pellets were placed in a sintering furnace, followed by sintering at a temperature of 1400° C. for 36 hours to obtain target 1.
Preparation of Multilayer Body Composed of Oxide Layer/Metal Layer The Si substrate prepared in the same manner as in Example 1 was set in a vacuum deposition apparatus (manufactured by ULVAC, EX-400). By using an electron beam deposition apparatus installed in the deposition apparatus and target 1 prepared, an oxide layer (ITZO:Eu) was formed through a metal mask at a deposition rate of 0.05 nm/s to a thickness of 5 nm, followed by deposition of gold at a deposition rate of 0.05 nm/s to a thickness of 50 nm to form a metal layer. Multilayer electrodes of the oxide layer/metal layer were formed such that the distance (channel length, L) was 75 μm and the width (channel width, W) was 5 mm.

Further, by the method of forming a film using the above-mentioned electron beam deposition apparatus, a thin film composed only of ITZO and Eu was formed and evaluated. As a result, it was confirmed that IPox=5.80 eV, IPox>IPmm and IPox>IPorg.

Example 8

An organic thin film transistor was fabricated and evaluated in the same manner as in Example 7 except that an oxide layer (ITZO) formed using target 2 prepared by the following method in place of target 1. As a result, it was confirmed that the on/off ratio was 8×10³, the field-effect mobility 0.022 cm²/Vs and the threshold voltage −9.8 V. Table 1 shows the results.
Preparation of Target 2

A powder mixture of indium oxide, tin oxide and zinc oxide, which were mixed such that the molar ratio of indium (In/(In+Sn+Zn)) was 0.6, the molar ratio of tin (Sn/(In+Sn+Zn)) 0.3, and the molar ratio of zinc (Zn/(In+Sn+Zn)) 0.1, and which had an average particle diameter of 1 μm or less, was placed in a wet ball mill container and mixed and pulverized over 72 hours. Subsequently, the resultant pulverized powder was granulated, followed by press-molding to form pellets. The pellets were disposed in a sintering furnace, and then sintered at a temperature of 1400° C. for 36 hours to obtain target 2.

Further, in the same manner as in Example 7, a thin film composed only of ITZO was formed by the method of forming a film using the electron beam deposition apparatus, and evaluated. As a result, it was confirmed that IPox=5.23 eV, IPox<IPmm and IPox<IPorg.

Comparative Example 1

A top-contact type organic thin film transistor was fabricated according to the following procedures:

A Si substrate (n-type, specific resistance of 1 Ωcm, and double as the gate electrode) was surface-oxidized by thermal oxidation to form a thermally oxidized film having a thickness of 300 nm on the substrate, to make it to be an insulator layer. Further, the SiO₂ film opposite side of the SiO₂ becoming the insulator layer of the substrate was fully removed by dry etching, then, chromium film was formed by sputtering to a thickness of 20 nm on the surface after removing SiO₂. Further, gold (Au) film was formed to a thickness of 100 nm on the chromium film by sputtering to make it to be a lead-out electrode for the gate electrode. The resultant substrate was washed by ultrasonic cleaning with a neutral detergent, pure water, acetone and ethanol each for 30 minutes and further subjected to UV ozone cleaning. Then, a self-assembled film was formed from hexamethyl disilazane by the gas phase method.

Subsequently, the substrate was set in a vacuum deposition apparatus (manufactured by ULVAC, EX-400). Pentacene was deposited at a deposition rate of 0.05 nm/s to form an organic semiconductor layer having a thickness of 50 nm. Further, gold film was formed through a metal mask at a deposition rate of 0.05 nm/s to a thickness of 50 nm, and source-drain electrodes were formed with a distance (channel length, L) of 75 μm and a width (channel width, W) of 5 mm, to obtain a top-contact type organic thin film transistor.

The resultant organic thin film transistor was evaluated in the same manner as in Example 1, and it was found that the on/off ratio was 3×10³, the field-effect mobility 0.4 cm²/Vs and the threshold voltage −20.0 V. Table 1 shows the results.

Comparative Example 2

A bottom-contact type organic thin film transistor was fabricated according to the following procedures:

A Si substrate (n-type, specific resistance of 1 Ωcm, and double as the gate electrode) was surface-oxidized by thermal oxidation to form a thermal oxidized film having a thickness of 300 nm on the substrate, to make it to be an insulator layer. Further, the SiO₂ film opposite side of the SiO₂ becoming the insulator layer of the substrate was fully removed by dry etching, then, chromium film was formed by sputtering to a thickness of 20 nm on the surface after removing SiO₂. Further, a gold (Au) film was formed to a thickness of 100 nm on the chromium film by sputtering to make it to be a lead-out electrode for the gate electrode. The resultant substrate was washed by ultrasonic cleaning with a neutral detergent, pure water, acetone and ethanol each for 30 minutes and further subjected to UV ozone cleaning. Then, a self-assembled film was formed from hexamethyl disilazane by the gas phase method.

Subsequently, the above-mentioned substrate was set in a vacuum deposition apparatus (manufactured by ULVAC, EX-400). Gold was deposited through a metal mask at a deposition rate of 0.05 nm/s to form source-drain electrodes having a film thickness of 50 nm, followed by deposition of pentacene without using a metal mask at a deposition rate of 0.05 nm/s to form an organic semiconductor layer having a thickness of 50 nm. Thus, the organic thin film transistor was fabricated. Here, the source-drain electrodes are formed such that the distance therebetween (channel length, L) was 75 μm and the width (channel width, W) was 5 mm.

The resultant organic thin film transistor was evaluated in the same manner as in Example 1, and the on/off ratio was $6 \times 10^2$, the field-effect mobility 0.015 $cm^2$/Vs and the threshold voltage −18.0 V. Table 1 shows the results.

Further, a thin film composed only of gold was formed and evaluated in the same manner as in Example 1. As a result, it was found that IPmm=5.1 eV. Table 2 shows the results.

Comparative Example 3

An organic thin film transistor was fabricated and evaluated in the same manner as in Example 1 except that no oxide layer was formed. As a result, the on/off ratio was $7 \times 10^2$, the field-effect mobility 0.10 $cm^2$/Vs and the threshold voltage −1.4 V. Table 1 shows the results.

Comparative Example 4

An organic thin film transistor was fabricated and evaluated in the same manner as in Example 1 except that the thickness of the oxide layer was changed to 5 nm and no organic thin film layer was formed. As a result, the on/off ratio was $9 \times 10^1$, the field-effect mobility 0.0036 $cm^2$/Vs and the threshold voltage +8.6 V. Table 1 shows the results.

Comparative Example 5

An organic thin film transistor was fabricated and evaluated in the same manner as in Example 2 except that no oxide layer was formed. As a result, the on/off ratio was $3 \times 10^3$, the field-effect mobility 0.079 $cm^2$/Vs and the threshold voltage −5.2 V. Table 1 shows the results.

Comparative Example 6

An organic thin film transistor was fabricated and evaluated in the same manner as in Example 3 except that no oxide layer and no organic thin film layer were formed. As a result, the on/off ratio was $7 \times 10^2$, the field-effect mobility 0.027 $cm^2$/Vs and the threshold voltage −15.5 V. Table 1 shows the results.

Comparative Example 7

An organic thin film transistor was fabricated and evaluated in the same manner as in Example 3 except that no oxide layer was formed. As a result, the on/off ratio was $2 \times 10^4$, the field-effect mobility 0.087 $cm^2$/Vs and the threshold voltage −23.2 V. Table 1 shows the results.

Comparative Example 8

An organic thin film transistor was fabricated and evaluated in the same manner as in Example 3 except that no organic thin film layer was formed. As a result, the on/off ratio was $3 \times 10^3$, the field-effect mobility 0.021 $cm^2$/Vs and the threshold voltage −25.3 V. Table 1 shows the results.

Comparative Example 9

An organic thin film transistor was fabricated and evaluated in the same manner as in Example 4 except that no oxide layer was formed. As a result, the on/off ratio was $2 \times 10^3$, the field-effect mobility 0.042 $cm^2$/Vs and the threshold voltage −26.4 V. Table 1 shows the results.

Comparative Example 10

An organic thin film transistor was fabricated and evaluated in the same manner as in Example 4 except that no organic thin film layer was formed. As a result, the on/off ratio was $3 \times 10^3$, the field-effect mobility 0.005 $cm^2$/Vs and the threshold voltage −22.8 V. Table 1 shows the results.

Comparative Example 11

An organic thin film transistor was fabricated and evaluated in the same manner as in Comparative Example 1 except that the organic semiconductor layer was formed using 4MSB in place of pentacene. As a result, the on/off ratio was $6 \times 10^3$, the field-effect mobility 0.053 $cm^2$/Vs and the threshold voltage −10.3 V. Table 1 shows the results.

Comparative Example 12

An organic thin film transistor was fabricated and evaluated in the same manner as in Comparative Example 2 except that the organic semiconductor layer was formed using 4MSB in place of pentacene. As a result, the on/off ratio was $8 \times 10^2$, the field-effect mobility 0.00049 $cm^2$/Vs and the threshold voltage −9.9 V. Table 1 shows the results.

Comparative Example 13

An organic thin film transistor was fabricated and evaluated in the same manner as in Example 6 except that no oxide layer was formed. As a result, the on/off ratio was $1 \times 10^4$, the field-effect mobility 0.0052 $cm^2$/Vs and the threshold voltage −11.4 V. Table 1 shows the results.

Comparative Example 14

An organic thin film transistor was fabricated and evaluated in the same manner as in Example 6 except that no organic thin film layer was formed. As a result, the on/off ratio was $2 \times 10^3$, the field-effect mobility 0.0014 $cm^2$/Vs and the threshold voltage −27.2 V. Table 1 shows the results.

TABLE 1

| | Constitution | Substrate | Insulator layer | Oxide layer | Metal layer | Organic thin film layer | Organic semiconductor layer | Threshold voltage [V] | Mobility [cm²/Vs] | On/off ratio [—] |
|---|---|---|---|---|---|---|---|---|---|---|
| Ex. 1 | *¹BC | Si | *²SiO₂(300) | MoO₃(2) | Au(50) | PFTP | Pentacene(50) | −5.7 | 0.30 | 4E+03 |
| Comp. Ex. 1 | *¹TC | Si | SiO₂(300) | — | Au(50) | — | Pentacene(50) | −20.0 | 0.40 | 3E+03 |
| Comp. Ex. 2 | BC | Si | SiO₂(300) | — | Au(50) | — | Pentacene(50) | −18.0 | 0.015 | 6E+02 |
| Comp. Ex. 3 | BC | Si | SiO₂(300) | — | Au(50) | PFTP | Pentacene(50) | −1.4 | 0.10 | 7E+02 |
| Comp. Ex. 4 | BC | Si | SiO₂(300) | MoO₃(5) | Au(50) | — | Pentacene(50) | 8.6 | 0.0036 | 9E+01 |
| Ex. 2 | BC | Si | SiO₂(300) | MoO₃(2) | Au(50) | FTP | Pentacene(50) | −4.7 | 0.15 | 3E+03 |
| Comp. Ex. 5 | BC | Si | SiO₂(300) | — | Au(50) | FTP | Pentacene(50) | −5.2 | 0.079 | 3E+03 |
| Ex. 3 | BC | Glass | Parylene(800) | MoO₃(2) | Au(50) | PFTP | Pentacene(50) | −17.9 | 0.10 | 6E+03 |
| Comp. Ex. 6 | BC | Glass | Parylene(800) | — | Au(50) | — | Pentacene(50) | −15.5 | 0.027 | 7E+02 |
| Comp. Ex. 7 | BC | Glass | Parylene(800) | — | Au(50) | PFTP | Pentacene(50) | −23.2 | 0.087 | 2E+04 |
| Comp. Ex. 8 | BC | Glass | Parylene(800) | MoO₃(2) | Au(50) | — | Pentacene(50) | −25.3 | 0.021 | 3E+03 |
| Ex. 4 | BC | Glass | Parylene(800) | MoO₃(5) | Au(50) | FTP | Pentacene(50) | −21.2 | 0.12 | 2E+04 |
| Comp. Ex. 9 | BC | Glass | Parylene(800) | — | Au(50) | FTP | Pentacene(50) | −26.4 | 0.042 | 2E+03 |
| Comp. Ex. 10 | BC | Glass | Parylene(800) | MoO₃(5) | Au(50) | — | Pentacene(50) | −22.8 | 0.005 | 3E+03 |
| Ex. 5 | BC | Si | SiO₂(300) | MoO₃(2) | Au(50) | TFMTP | Pentacene(50) | −1.4 | 0.095 | 3E+03 |
| Ex. 6 | BC | Si | SiO₂(300) | MoO₃(5) | Au(50) | PFTP | 4MSB(50) | −7.3 | 0.038 | 8E+04 |
| Comp. Ex. 11 | TC | Si | SiO₂(300) | — | Au(50) | — | 4MSB(50) | −10.3 | 0.053 | 6E+03 |
| Comp. Ex. 12 | BC | Si | SiO₂(300) | — | Au(50) | — | 4MSB(50) | −9.9 | 4.9E−04 | 8E+02 |
| Comp. Ex. 13 | BC | Si | SiO₂(300) | — | Au(50) | PFTP | 4MSB(50) | −11.4 | 0.0052 | 1E+04 |
| Comp. Ex. 14 | BC | Si | SiO₂(300) | MoO₃(5) | Au(50) | — | 4MSB(50) | −27.2 | 0.0014 | 2E+03 |
| Ex. 7 | BC | Si | SiO₂(300) | ITZO:Eu(5) | Au(50) | PFTP | 4MSB(50) | −6.9 | 0.042 | 3E+04 |
| Ex. 8 | BC | Si | SiO₂(300) | ITZO(5) | Au(50) | PFTP | 4MSB(50) | −9.8 | 0.022 | 8E+03 |

*¹BC represents a bottom-contact type and TC a top-contact type.
*²The numerical value in parenthesis represents a film thickness [nm].

TABLE 2

| | Constitution | Organic thin film layer | IPmm [eV] | Threshold voltage [V] | Mobility [cm²/Vs] | On/off ratio [—] |
|---|---|---|---|---|---|---|
| Comp. Ex. 1 | TC | — | — | −20.0 | 0.40 | 3 × 10³ |
| Comp. Ex. 2 | BC | — | 5.1 | −18.0 | 0.015 | 6 × 10² |
| Ex. 2 | BC | FTP | 5.3 | −4.7 | 0.15 | 3 × 10³ |
| Ex. 1 | BC | PFTP | 5.6 | −5.7 | 0.30 | 4 × 10³ |
| Ex. 5 | BC | TFMTP | 5.8 | −1.4 | 0.095 | 3 × 10³ |

As is understood from the results obtained, the work function of the metal layer composed only of gold is 5.1 eV while the work functions of the surface-modified metal layers formed by treatment of the surface of the metal layer with FTP, PFTP or TFMTP are 5.3 eV, 5.6 eV and 5.8 eV, respectively. It is found that the surface-modification of the metal layer with the organic thin film layer varies the effective work function of the multilayer body.

Further, taking it into consideration that the work function of the molybdenum oxide thin film (IPox) used for the oxide layer is 5.7 eV, it is understood that organic thin film transistors satisfying the following equation (1) have a good threshold voltage, mobility and on/off ratio.

$$IPox > IPmm \quad (1)$$

This fact is a significant synergistic effect which cannot be expected from respective structures of the oxide layer/metal layer and the metal layer electrode/organic thin film.

In addition, it is understood that when the HOMO level of an organic semiconductor layer is represented by IPorg, organic thin film transistors satisfying the following equation (2) have a good threshold voltage, mobility and on/off ratio.

$$IPox > IPorg \quad (2)$$

It is assumed that the barrier for charge-injection from the oxide layer be lowered.

INDUSTRIAL APPLICABILITY

The organic thin film transistor of the invention is useful as a transistor since it has high mobility and high storage stability.

The documents described in the specification are incorporated herein by reference in its entirety.

The invention claimed is:

1. A bottom-contact type organic thin film transistor comprising, on a substrate, at least a gate electrode, an insulator layer, a source electrode, a drain electrode and an organic semiconductor layer, wherein
at least one of the source electrode and the drain electrode has a multilayer structure formed by stacking a metal oxide layer and a metal layer,
the metal layer is surface-modified with an organic thin film layer,
the metal oxide layer contacts the organic semiconductor layer, and
the work function of the metal oxide layer represented by IPox and the work function of the metal layer represented by IPmm satisfy the following expression (1):

$$IPox > IPmm \quad (1).$$

2. The organic thin film transistor according to claim 1, wherein the work function of the oxide layer represented by IPox and the HOMO level of the organic semiconductor layer represented by IPorg satisfy the following expression (2):

$$IPox > IPorg \quad (2).$$

3. A method for producing the organic thin film transistor according to claim 2, comprising: forming the organic semiconductor layer by means of a solution process.

4. An apparatus comprising the organic thin film transistor according to claim 2.

5. A method for producing the organic thin film transistor according to claim 1, comprising: forming the organic semiconductor layer by means of a solution process.

6. An apparatus comprising the organic thin film transistor according to claim 1.

7. A bottom-contact type organic thin film transistor according to claim 1, wherein only said source electrode has a multilayer structure formed by stacking said metal oxide layer and said metal layer.

8. A bottom-contact type organic thin film transistor according to claim 1, wherein only said drain electrode has a multilayer structure formed by stacking said metal oxide layer and said metal layer.

9. A bottom-contact type organic thin film transistor according to claim 1, wherein both said source electrode and said drain electrode have a multilayer structure formed by stacking said metal oxide layer and said metal layer.

10. A bottom-contact type organic thin film transistor according to claim 1, wherein said organic thin film layer comprises a thiophenol, an alkanethiol, a fluorinated alkanethiol, or an aromatic alkanethiols.

* * * * *